(12) United States Patent
Zeng

(10) Patent No.: US 12,148,738 B2
(45) Date of Patent: Nov. 19, 2024

(54) DISPLAY PANEL AND DISPLAY DEVICE

(71) Applicant: Hubei Yangtze Industrial Innovation Center Of Advanced Display Co., Ltd., Wuhan (CN)

(72) Inventor: Yang Zeng, Shanghai (CN)

(73) Assignee: Hubei Yangtze Industrial Innovation Center of Advanced Display Co., Ltd., Wuhan (CN)

( * ) Notice: Subject to any disclaimer, the term of this patent is extended or adjusted under 35 U.S.C. 154(b) by 668 days.

(21) Appl. No.: 17/304,303

(22) Filed: Jun. 17, 2021

(65) Prior Publication Data

US 2021/0384171 A1 Dec. 9, 2021

(30) Foreign Application Priority Data

Nov. 30, 2020 (CN) .......................... 202011379140.6

(51) Int. Cl.
*H01L 25/075* (2006.01)
*H01L 27/15* (2006.01)
*H01L 33/50* (2010.01)
*H01L 33/62* (2010.01)

(52) U.S. Cl.
CPC ........ *H01L 25/0753* (2013.01); *H01L 27/156* (2013.01); *H01L 33/502* (2013.01); *H01L 33/62* (2013.01)

(58) Field of Classification Search
CPC . H01L 25/0753; H01L 27/156; H01L 33/502; H01L 33/62; H01L 25/167; H01L 33/48
See application file for complete search history.

(56) References Cited

U.S. PATENT DOCUMENTS

| 2018/0040665 A1* | 2/2018 | Ohmae | ................. H01L 33/46 |
| 2019/0088196 A1* | 3/2019 | Chu | ..................... G09G 3/2003 |
| 2020/0211941 A1* | 7/2020 | Xi | ..................... H01L 23/49811 |

FOREIGN PATENT DOCUMENTS

| CN | 102396067 A | 3/2012 |
| CN | 105023522 A | 11/2015 |
| CN | 114280841 A | 4/2022 |

* cited by examiner

*Primary Examiner* — Jonathan Han
(74) *Attorney, Agent, or Firm* — ALSTON & BIRD LLP

(57) ABSTRACT

Provided are a display panel and a display device. The display panel includes a first substrate. The first substrate includes mutiple sub-pixel areas arranged in an array. Each sub-pixel area includes a main bonding pad and a backup bonding pad which are disposed on the first substrate; and a micro light-emitting diode electrically connected to the main bonding pad or the backup bonding pad. The main bonding pad and the backup bonding pad are in a first symmetric manner about a first symmetric reference object. The sub-pixel area is in a second symmetric manner about a second symmetric reference object. The first symmetric manner is the same as the second symmetric manner. The distance between the vertical projection of the first symmetric reference object on the first substrate and the vertical projection of the second symmetric reference object on the first substrate is S1, and S1≤10 μm.

19 Claims, 7 Drawing Sheets

DISPLAY PANEL AND DISPLAY DEVICE

CROSS-REFERENCE TO RELATED APPLICATION(S)

This application claims priority to Chinese Patent Application No. 202011379140.6 filed Nov. 30, 2020, the disclosure of which is incorporated herein by reference in its entirety.

TECHNICAL FIELD

Embodiments of the present disclosure relate to the field of electronic displaying, in particular, a display panel and a display device.

BACKGROUND

At present, the micro light-emitting diode (micro-LED) display panel has received increasing attention from the display market due to the advantages of the micro-LED display panel such as high brightness, low operating voltage, low power consumption, long life, impact resistance, and stable performance.

The micro-LED display panel in the related art includes multiple sub-pixels arranged in an array, and each sub-pixel includes a main bonding pad and a backup bonding pad. In the case where the micro light-emitting diode on the main bonding pad is damaged, the micro light-emitting diode disposed on the backup bonding pad is enabled to ensure the display of the sub-pixel.

However, in the related art, the positions of the main bonding pad and the backup bonding pad with respect to the sub-pixel are different. Since the micro light-emitting diode has different light-emitting intensities in different directions, in the case where the sub-pixel is repaired, the light-emitting effect of the sub-pixel after being repaired is significantly different from the light-emitting effect of the sub-pixel before being repaired, which undoubtedly affects the display uniformity of the display panel.

SUMMARY

Embodiments of the present disclosure provide a display panel and a display device. Even if a sub-pixel is repaired, it can still be ensured that the sub-pixel has the same light-emitting effect as the sub-pixel when the sub-pixel is not repaired, thereby ensuring the display uniformity.

In a first aspect, an embodiment of the present disclosure provides a display panel. This display panel includes a first substrate.

The first substrate includes multiple sub-pixel areas arranged in an array. Each sub-pixel area includes a main bonding pad, a backup bonding pad, and a micro light-emitting diode.

The main bonding pad and the backup bonding pad are disposed on the first substrate.

The micro light-emitting diode is electrically connected to the main bonding pad or the backup bonding pad.

The main bonding pad and the backup bonding pad are disposed in a first symmetric manner with respect to a first symmetric reference object. The sub-pixel area is in a second symmetric manner with respect to a second symmetric reference object.

The first symmetric manner is the same as the second symmetric manner.

The distance between the vertical projection of the first symmetric reference object on the first substrate and the vertical projection of the second symmetric reference object on the first substrate is S1, and S1≤10 μm.

In a second aspect, an embodiment of the present disclosure further provides a display device including the display panel provided in the first aspect.

BRIEF DESCRIPTION OF DRAWINGS

Other features, objects, and advantages of the present disclosure will become more apparent from a detailed description of non-restrictive embodiments with reference to the drawings.

DETAILED DESCRIPTION

To make the objects, solutions, and advantages of the present disclosure clearer, the solutions of the present disclosure will be described below completely in conjunction with the drawings in embodiments of the present disclosure and the specific embodiments. The described embodiments are part, not all, of the embodiments of the present disclosure, and based on the embodiments of the present disclosure, other embodiments obtained by those skilled in the art on the premise that no creative work is done are within the scope of the present disclosure.

Figure 1:
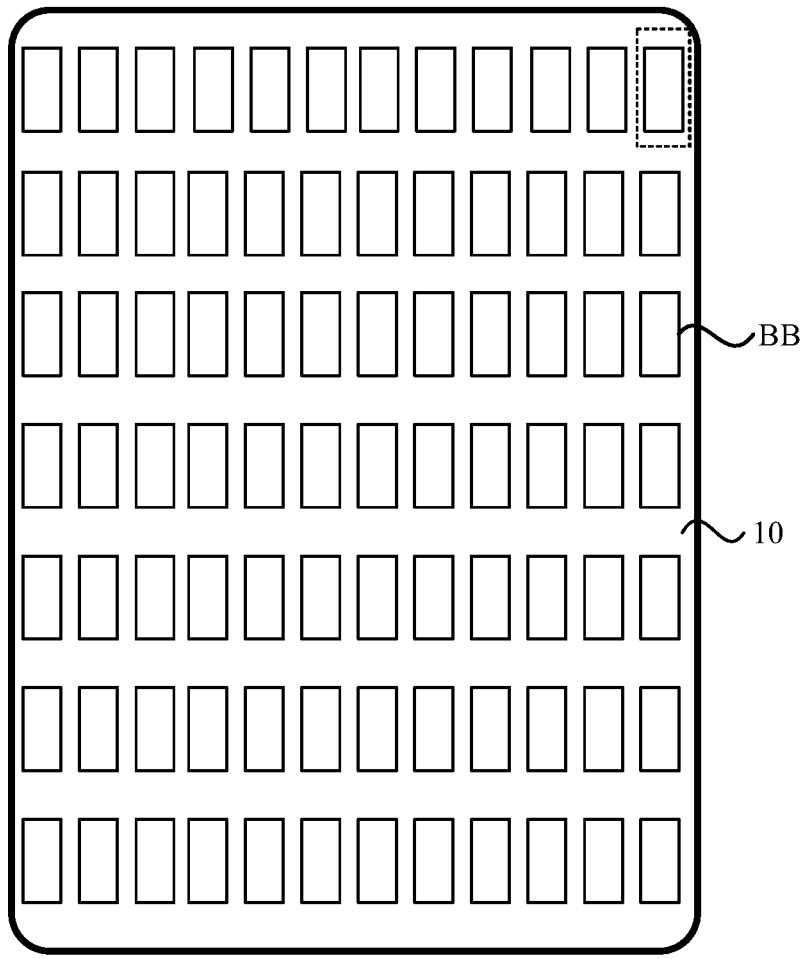
FIG. 1 is a simplified high-level structural view of a display panel according to an embodiment of the present disclosure.
Figure 2:
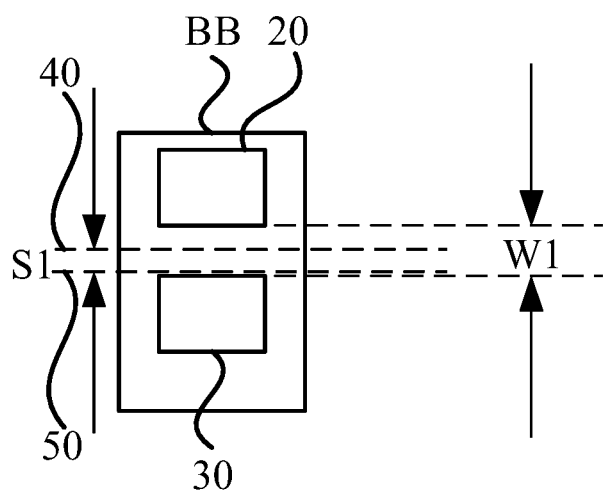
FIG. 2 is an enlarged view of the dashed box of FIG. 1.

In view of the problem in the background, an embodiment of the present disclosure provides a display panel. FIG. 1 is a simplified high-level structural view of a display panel according to an embodiment of the present disclosure, and FIG. 2 is an enlarged view of the dashed box of FIG. 1. As shown in FIG. 1 and FIG. 2, the display panel 100 provided in an embodiment of the present disclosure includes a first substrate 10. The first substrate 10 includes multiple sub-pixel areas BB arranged in an array. Each sub-pixel area BB includes a main bonding pad 20, a backup bonding pad 30, and a micro light-emitting diode 21. The main bonding pad 20 and the backup bonding pad 30 are disposed on the first substrate 10. The micro light-emitting diode 21 is electrically connected to the main bonding pad 20 or the backup bonding pad 30. The main bonding pad 20 and the backup bonding pad 30 are disposed in a first symmetric manner with respect to a first symmetric reference object 40. The sub-pixel area BB is disposed in a second symmetric manner with respect to a second symmetric reference object 50. The first symmetric manner is the same as the second symmetric manner. The distance between the vertical projection of the first symmetric reference object 40 on the first substrate 10 and the vertical projection of the second symmetric reference object 50 on the first substrate 10 is S1, and S1≤10 µm. It is to be noted that for products with different sizes, S1 may be set by referring to the following formula: S1/Q1<50%; and Q1 is the size of the long side of the micro light-emitting diode 21.

In an embodiment, each sub-pixel area BB is provided with a main bonding pad 20 and a backup bonding pad 30. In the case where the micro light-emitting diode 21 on the main bonding pad 20 is damaged, the micro light-emitting diode 21 with the same light-emitting color disposed on the backup bonding pad 30 is enabled, that is, the damaged micro light-emitting diode 21 on the main bonding pad 20 is replaced by the micro light-emitting diode 21 disposed on the backup bonding pad 30 for light-emitting, so that the display of the sub-pixel can be achieved. In this manner, the following problem can be solved: in the related art, in the case where the micro light-emitting diode 21 in the sub-pixel area is damaged, the sub-pixel where this micro light-emitting diode 21 is located cannot be displayed, and thus the display effect is affected.

Figure 3:
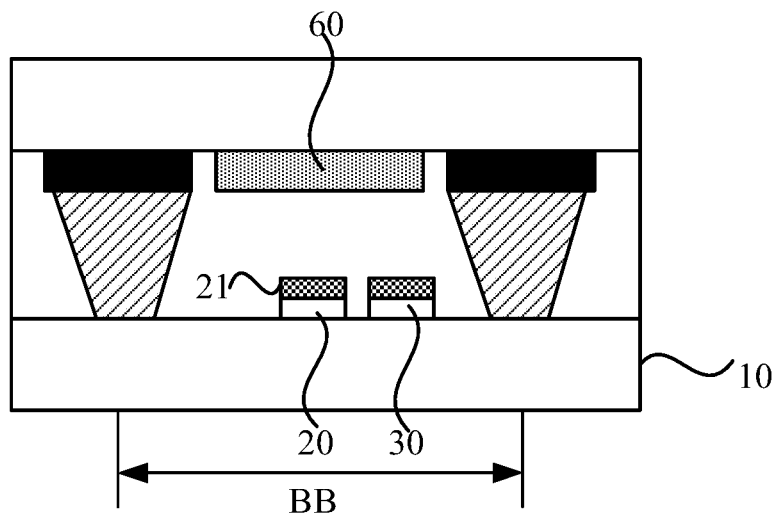
FIG. 3 is a partial structural view of a film layer of a display panel according to an embodiment of the present disclosure.
Figure 4:
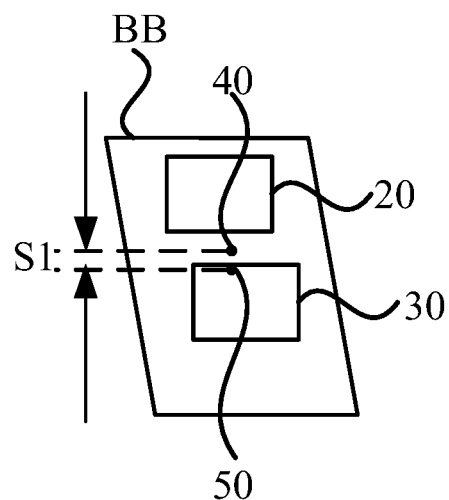
FIG. 4 is a partial structural view of a display panel according to an embodiment of the present disclosure.

Moreover, the micro light-emitting diode 21 has different light-emitting intensities in different directions, the position of the bonding pad determines the position of the micro light-emitting diode 21, and the position of the micro light-emitting diode 21 determines the light-emitting effect of the sub-pixel where this micro light-emitting diode 21 is located. Therefore, in the case where the positions of the main bonding pad 20 and the backup bonding pad 30 with respect to the sub-pixel are different, the positions of the micro light-emitting diode 21 electrically connected to the main bonding pad 20 and the micro light-emitting diode electrically connected to the backup bonding pad 30 with respect to the sub-pixel are different. In this manner, differences exist in the light-emitting effect of the sub-pixel. Further, part of film layers on one side of the micro light-emitting diode 21 facing away from the first substrate 10 have different edge and center morphologies during the manufacturing process. For example, in the case where a quantum dot structure is printed by the ink-jet printing technology, the coffee ring effect that the thickness of the quantum dot structure at the edge of the sub-pixel area BB is relatively greater and the thickness of the quantum dot structure in the middle part of the sub-pixel area BB is relatively less occurs. For another example, in the case where a color resist structure is made, the horn effect that a raised horn shape is formed at the overlap of the color resist structure and a shielding structure occurs. Therefore, in the case where the positions of the main bonding pad 20 and the backup bonding pad 30 with respect to the sub-pixel are different, when the light emitted by the micro light-emitting diode 21 electrically connected to the main bonding pad 20 and the light emitted by the micro light-emitting diode 2 electrically connected to the backup bonding pad 30 pass through the subsequent film layer of the sub-pixel, the subsequent film layer has different effects on the light, which in turn may also cause differences in the light-emitting effect of the sub-pixel. FIG. 3 is an exemplary partial structural view of the film layer of a display panel according to an embodiment of the present disclosure. As shown in FIG. 3, the main bonding pad 20 is adjacent to the center of the sub-pixel area BB, and the backup bonding pad 30 is adjacent to the edge of the sub-pixel area BB, that is, the positions of the main bonding pad 20 and the backup bonding pad 30 with respect to the sub-pixel have a relatively large difference. In the case where a color resist structure 60 is disposed at one side of the micro light-emitting diode 21 facing away from the first substrate 10, and the light emitted by the micro light-emitting diode 21 electrically connected to the main bonding pad 20 and the light emitted by the micro light-emitting diode 21 electrically connected to the backup bonding pad 30 pass through the color resist structure 60, due to the different edge and center morphologies of the color resist structure 60, the effect of the color resist structure 60 on the light emitted by the micro light-emitting diode 21 electrically connected to the main bonding pad 20 and adjacent to the center of the sub-pixel area BB and the effect of the color resist structure 60 on the light emitted by the micro light-emitting diode 21 electrically connected to the backup bonding pad 30 and adjacent to the edge of the sub-pixel area BB are different so that differences exist in the light-emitting effect of the sub-pixel. That is, in the case where the micro light-emitting diode 21 on the main bonding pad 20 is damaged, and the micro light-emitting diode 21 on the backup bonding pad 30 is enabled to ensure the light-emitting of the sub-pixel, obvious differences exist in the light-emitting effect of this sub-pixel, and thus the display effect is affected. Referring to FIG. 4, it is seen that in this embodiment, the main bonding pad 20 and the backup bonding pad 30 are disposed in the first symmetric manner with respect to the first symmetric reference object 40, the sub-pixel area BB is disposed in the second symmetric manner with respect to the second symmetric reference object 50, and the first symmetric manner is the same as the second symmetric manner. In this manner, the positions of the main bonding pad 20 and the backup bonding pad 30 with respect to the sub-pixel are basically the same, that is, the positions of the micro light-emitting diode electrically connected to the main bonding pad 20 and the micro light-emitting diode electrically connected to the backup bonding pad 30 with respect to the sub-pixel are the same. Further, even if the subsequent film layer has an impact on the light emitted by the micro light-emitting diode, since the morphology of the subsequent film layer is symmetrically arranged, the effect of the subsequent film layer on the light emitted by the micro light-emitting diode electrically connected to the main bonding pad 20 and the effect of the subsequent film layer on the light emitted by the micro light-emitting diode electrically connected to the backup bonding pad 30 are basically the same. In this manner, even if the sub-pixel is repaired, the light-emitting effect of the sub-pixel after being repaired and the light-emitting effect of the sub-pixel before being repaired are basically the same so that the following problem can be avoided: obvious differences exist between the light-emitting effect of the sub-pixel after being repaired and the light-emitting effect of the sub-pixel before being repaired, and thus the display uniformity of the display panel is affected.

The first symmetric manner and the second symmetric manner may be axisymmetric, and the first symmetric manner and the second symmetric manner may also be centrosymmetric. In the case where the first symmetric manner and the second symmetric manner are axisymmetric, correspondingly, the symmetric reference object is an axis of symmetry; in the case where the first symmetric manner and the second symmetric manner are centrosymmetric, correspondingly, the symmetric reference is defined by a center of symmetry.

Exemplarily, with continued reference to FIG. 2, the first symmetric manner and the second symmetric manner are both axisymmetric. The first symmetric reference object 40 is a first axis of symmetry, the second symmetric reference object 50 is a second axis of symmetry, and the first axis of symmetry is in parallel with the second axis of symmetry. That is, the main bonding pad 20 and the backup bonding pad 30 are axis-ymmetric with respect to the first axis of symmetry, and the sub-pixel area BB where the main bonding pad 20 and the backup bonding pad 30 are located is axis-ymmetric with respect to the second axis of symmetry. Moreover, the first axis of symmetry is in parallel with the second axis of symmetry, the distance between the vertical projection of the first axis of symmetry on the first substrate 10 and the vertical projection of the second axis of symmetry on the first substrate 10 is S1, and S1≤10 μm. For example, S1 is 0, that is, the first axis of symmetry coincides with the second axis of symmetry.

FIG. 4 is an exemplary partial structural view of a display panel according to an embodiment of the present disclosure. As shown in FIG. 4, the first symmetric manner and the second symmetric manner are both centrosymmetric. The first symmetric reference object 40 is a first center of symmetry, and the second symmetric reference object 50 is a second center of symmetry. That is, the main bonding pad 20 and the backup bonding pad 30 are centrosymmetric with respect to the first center of symmetry, and the sub-pixel area BB where the main bonding pad 20 and the backup bonding pad 30 are located is centrosymmetric with respect to the second center of symmetry. Moreover, the distance between the vertical projection of the first center of symmetry on the first substrate 10 and the vertical projection of the second center of symmetry on the first substrate 10 is S1, and S1≤10 μm. For example, S1 is 0, that is, the first center of symmetry coincides with the second center of symmetry.

Optionally, the first substrate 10 may be a rigid substrate or a flexible substrate. In the case where the first substrate 10 is a rigid substrate, the first substrate 10 may be made of, for example, glass; in the case where the first substrate 10 is a flexible substrate, the first substrate 10 may be made of, for example, at least one of polyetherimide (PEI), polyethylene terephthalate (PET), polyimide (PI), or polyethylene naphthalate (PEN).

Figure 5:
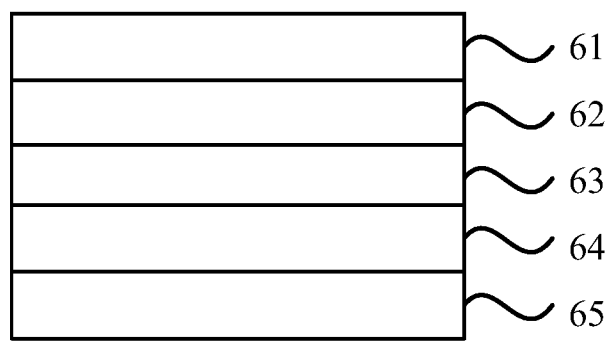
FIG. 5 is a structural view of a single-electrode micro light-emitting diode according to an embodiment of the present disclosure.
Figure 6:
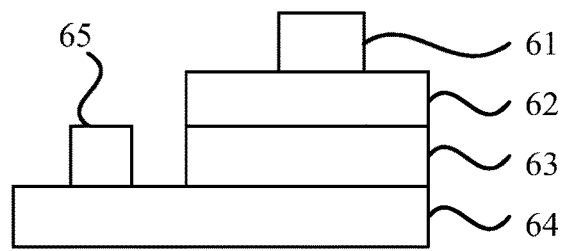
FIG. 6 is a structural view of a double-electrode micro light-emitting diode according to an embodiment of the present disclosure.

Optionally, the micro light-emitting diode may include a single-electrode micro light-emitting diode or a double-electrode micro light-emitting diode, which may be selected by those skilled in the art according to actual conditions, and is not specifically limited in this embodiment. FIG. 5 is a structural view of a single-electrode micro light-emitting diode according to an embodiment of the present disclosure. As shown in FIG. 5, in the case where the micro light-emitting diode includes a single-electrode micro light-emitting diode, the single-electrode micro light-emitting diode includes a first electrode 61, a first type semiconductor layer 62, an active layer 63, a second type semiconductor layer 64, and a second electrode 65 which are disposed in sequence and facing away from the first substrate 10. FIG. 6 is a structural view of a double-electrode micro light-emitting diode according to an embodiment of the present disclosure. As shown in FIG. 6, in the case where the micro light-emitting diode includes a double-electrode micro light-emitting diode, the double-electrode micro light-emitting diode includes a first type semiconductor layer 62, an active layer 63, and a second type semiconductor layer 64 which are disposed in sequence and facing away from the first substrate 10. The double-electrode micro light-emitting diode further includes a first electrode 61 and a second electrode 65. The first electrode 61 is located on one side of the first type semiconductor layer 62 facing away from the active layer 63, and the second electrode 65 is located on one side of the second type semiconductor layer 64 facing toward the active layer 63.

It is understood that the display panel 100 in an embodiment of the present disclosure may be an active matrix light-emitting diode display panel or a passive matrix light-emitting diode display panel. In the case where the display panel 100 is an active matrix light-emitting diode display panel, each sub-pixel area BB in the display panel 100 is further provided with a driver circuit (not shown in the figure), and the driver circuit is electrically connected to the micro light-emitting diode and configured for driving the micro light-emitting diode in the corresponding sub-pixel area BB to emit light. On the premise that the preceding functions can be achieved, embodiments of the present disclosure do not specifically limit the specific structure of the driver circuit. In the case where the display panel 100 is a passive matrix light-emitting diode display panel, the micro light-emitting diodes may be driven in rows, columns, or individually, and the specific driving manner is not specifically limited in embodiments of the present disclosure.

Figure 7:
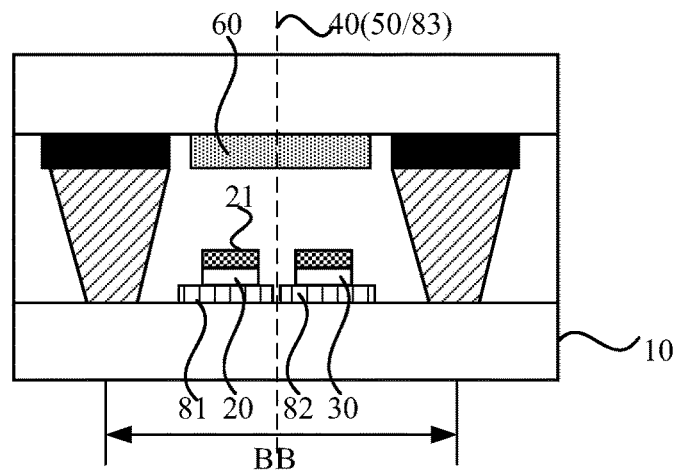
FIG. 7 is a partial structural view of a film layer of a display panel according to another embodiment of the present disclosure.
Figure 8:
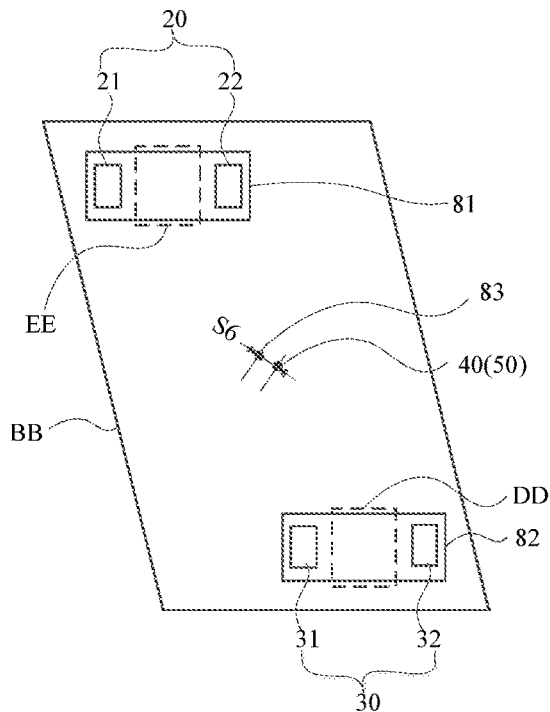
FIG. 8 is a partial structural view of a display panel according to another embodiment of the present disclosure.
Figure 9:
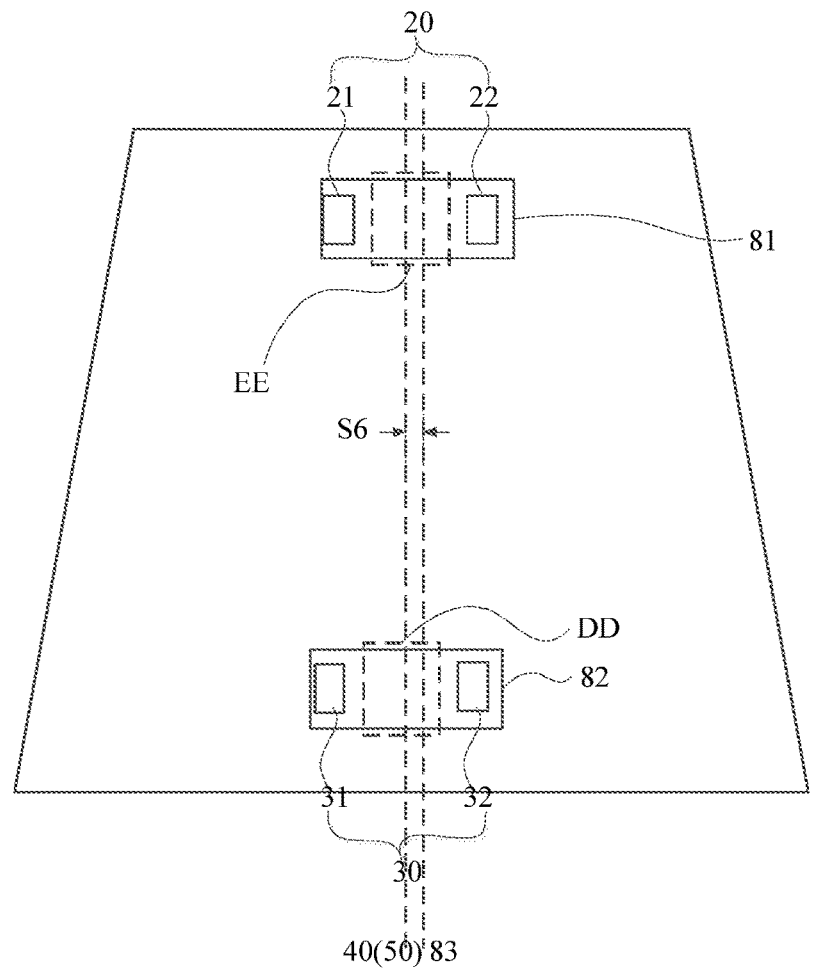
FIG. 9 is a partial structural view of a display panel according to another embodiment of the present disclosure.

FIG. 7 is a partial structural view of the film layer of a display panel according to another embodiment of the present disclosure. As shown in FIG. 7, the sub-pixel area BB further includes a first reflecting unit 81 and a second reflecting unit 82. The first reflecting unit 81 is located on one side of the main bonding pad 20 facing toward the first substrate 10, and the second reflecting unit 82 is located on one side of the backup bonding pad 30 facing toward the first substrate 10. The first reflecting unit 81 and the second reflecting unit 82 are in a seventh symmetric manner with respect to a seventh symmetric reference object 83. The first symmetric manner is the same as the seventh symmetric manner. The distance between the vertical projection of the seventh symmetric reference object 83 on the first substrate and the vertical projection of the first symmetric reference object on the first substrate is S6 (as shown in FIGS. 8-9), and S6≤10 μm. It is to be noted that for products with different sizes, S6 may be set by referring to the following formula: S6/Q1<50%; and Q1 is the size of the long side of the micro light-emitting diode 21. In FIG. 7, the case where S6 is set to 0, that is, the first symmetric reference object 40, the second symmetric reference object 50, and the seventh symmetric reference object 83 overlap, is used as an example. In the case where the micro light-emitting diode 21 electrically connected to the main bonding pad 20 emits light, the first reflecting unit 81 reflects the light emitted by the micro light-emitting diode 21 electrically connected to the main bonding pad 20. In the case where the micro light-emitting diode 21 electrically connected to the backup bonding pad 30 is enabled, the second reflecting unit 82 reflects the light emitted by the micro light-emitting diode 21 electrically connected to the backup bonding pad 30, that is, the light-emitting efficiency of the sub-pixel is improved by the reflecting units. Moreover, the reflecting units are disposed under the main bonding pad 20 and the backup bonding pad 30, respectively; the first reflecting unit 81 and the second reflecting unit 82 are in the seventh symmetric manner with respect to the seventh symmetric reference object 83; the first symmetric manner is the same as the seventh symmetric manner; the distance between the vertical projection of the seventh symmetric reference object 83 on the first substrate 10 and the vertical projection of the first symmetric reference object 40 on the first substrate 10 is relatively less, which further makes the light-emitting effect of the sub-pixel after repair basically the same as the light-emitting effect of the sub-pixel before repair. Optionally, in the case where the display panel is an active matrix light-emitting diode display panel, the driver circuit in the display panel includes, for example, multiple metal layers, and the first reflecting layer and the second reflecting layer may be disposed, for example, in the same layer as the metal layer closest to the main bonding pad among the multiple metal layers. In this manner, the processing step can be simplified.

To sum up, in the display panel provided in an embodiment of the present disclosure, each sub-pixel area is provided with a main bonding pad and a backup bonding pad. In the case where the micro light-emitting diode on the main bonding pad is damaged, the micro light-emitting diode on the backup bonding pad is enabled to ensure the display of the sub-pixel. In this manner, the following problem can be solved: in the related art, in the case where the micro light-emitting diode is damaged, the sub-pixel where the micro light-emitting diode is located cannot be displayed. Further, since the main bonding pad and the backup bonding pad are in a first symmetric manner with respect to a first symmetric reference object, and the sub-pixel area where the main bonding pad and the backup bonding pad are located is in a second symmetric manner with respect to a second symmetric reference object, the positions of the main bonding pad and the backup bonding pad with respect to the sub-pixel are basically the same, that is, the positions of the micro light-emitting diode electrically connected to the main bonding pad and the micro light-emitting diode electrically connected to the backup bonding pad with respect to the sub-pixel are basically the same. In this manner, the following problem can be avoided: in the case where the positions of the main bonding pad and the backup bonding pad with respect to the sub-pixel are different, differences exist in the light-emitting effect of the sub-pixel. Moreover, even if the subsequent film layer has an impact on the light emitted by the micro light-emitting diode, since the morphology of the subsequent film layer is symmetrically arranged, the effect of the subsequent film layer on the light emitted by the micro light-emitting diode electrically connected to the main bonding pad and the effect of the subsequent film layer on the light emitted by the micro light-emitting diode electrically connected to the backup bonding pad are basically the same. In this manner, even if the sub-pixel is repaired, the light-emitting effect of the sub-pixel after being repaired and the light-emitting effect of the sub-pixel before being repaired are basically the same so that the following problem can be avoided: obvious differences exist between the light-emitting effect of the sub-pixel after being repaired and the light-emitting effect of the sub-pixel before being repaired, and thus the display uniformity of the display panel is affected.

Optionally, with continued reference to FIG. 2, the distance W1 between the main bonding pad 20 and the backup bonding pad 30 ranges from 10 μm to 50 μm. For example, the distance W1 between the main bonding pad 20 and the backup bonding pad 30 may be 10 μm, 15 μm, 20 μm, 30 μm, or 50 μm. The distance between the main bonding pad 20 and the backup bonding pad 30 ranges from 10 μm to 50 μm so that the following two cases are avoided. In the first case, the distance between the main bonding pad 20 and the backup bonding pad 30 is so long that both the main bonding pad 20 and the backup bonding pad 30 are located at the edge of the sub-pixel area BB. In this case, no matter the micro light-emitting diode electrically connected to the main bonding pad 20 emits light or the micro light-emitting diode on the backup bonding pad 30 is enabled to emit light, the luminous flux of the sub-pixel is reduced, and thus the light-emitting effect is affected. In the second case, the distance between the main bonding pad 20 and the backup bonding pad 30 is so short that the short circuit between the main bonding pad 20 and the backup bonding pad 30 occurs, and thus the display of the micro light-emitting diode is affected. Therefore, in this embodiment, the distance between the main bonding pad 20 and the backup bonding pad 30 preferably ranges from 10 μm to 50 μm. In this manner, while a better light-emitting effect of the display panel 100 is ensured, the normal display of the micro light-emitting diode is not affected.

Figure 10:
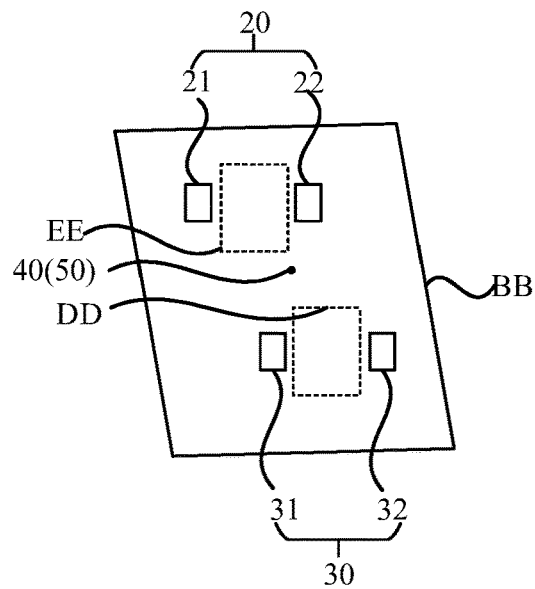
FIG. 10 is a partial structural view of a display panel according to another embodiment of the present disclosure.

Further, the main bonding pad and the backup bonding pad may be prevented from short-circuiting not only by limiting the distance between the main bonding pad and the backup bonding pad but also by configuring the positional relationship between the main bonding pad and the backup bonding pad. FIG. 10 is a partial structural view of a display panel according to another embodiment of the present disclosure. As shown in FIG. 10, the first symmetric manner and the second symmetric manner are both centro-symmetric; the first symmetric reference object is a first center of symmetry, and the second symmetric reference object is a second center of symmetry. In FIG. 10, the case where S1 is set to 0, that is, the first center of symmetry coincides with the second center of symmetry, is used as an example. The main bonding pad 20 includes a first main bonding pad 21 and a second main bonding pad 22; the backup bonding pad 30 includes a first backup bonding pad 31 and a second backup bonding pad 32. That is, in this case, the micro light-emitting diode electrically connected to the main bonding pad 20 or the micro light-emitting diode electrically connected to the backup bonding pad 30 is a double-electrode micro light-emitting diode. The projection of the first backup bonding pad 31 on the connecting line of the first main bonding pad 21 with the second main bonding pad 22 is located within a gap EE between the first main bonding pad 21 and the second main bonding pad 22. The projection of the second main bonding pad 22 on the connecting line of the first backup bonding pad 31 with the second backup bonding pad 32 is located within a gap DD between the first backup bonding pad 31 and the second backup bonding pad 32. That is, the first main bonding pad 21 and the second main bonding pad 22 of the main bonding pad 20 and the first backup bonding pad 31 and the second backup bonding pad 32 of the backup bonding pad 30 are staggered. In this manner, the short circuit among the first main bonding pad 21, the second main bonding pad 22, the first backup bonding pad 31, and the second backup bonding pad 32 can be avoided.

Optionally, in the case where the first symmetric manner and the second symmetric manner are both axisymmetric, the first symmetric reference object is the first axis of symmetry, and the second symmetric reference object is the second axis of symmetry; the first axis of symmetry is in parallel with the second axis of symmetry, and second axes of symmetry of the sub-pixel areas are in parallel with each other. To illustrate this beneficial effect, the following content will be compared with the case where second axes of symmetry in the sub-pixel areas in the display panel are partially in parallel with one another and partially perpendicular to one another. The case where S1 is set to 0, that is, the first axis of symmetry coincides with the second axis of symmetry, is used as an example.

Figure 11:
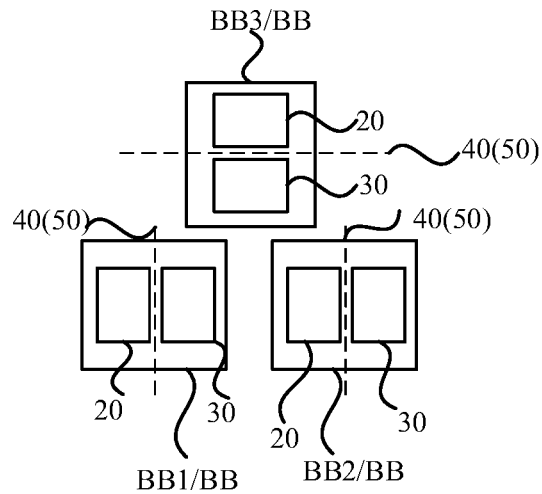
FIG. 11 is a partial structural view of a display panel according to another embodiment of the present disclosure.

Exemplarily, FIG. 11 is a partial structural view of a display panel according to another embodiment of the present disclosure. As shown in FIG. 11, the multiple sub-pixel areas BB include a first sub-pixel area BB1, a second sub-pixel area BB2, and a third sub-pixel area BB3. The second axis of symmetry of the first sub-pixel area BB1 is in parallel with the second axis of symmetry of the second sub-pixel area BB2, and the second axis of symmetry of the first sub-pixel area BB1 is perpendicular to the second axis of symmetry of the third sub-pixel area BB3. Since the directions of the axes of symmetry are different, it indicates that the placement directions of the micro light-emitting diodes are different. In this manner, in the case where the micro light-emitting diode is transferred to the corresponding sub-pixel area BB, since the second axis of symmetry of the first sub-pixel area BB1 is in parallel with the second axis of symmetry of the second sub-pixel area BB2, the micro light-emitting diode in the first sub-pixel area BB1 and the micro light-emitting diode in the second sub-pixel area BB2 may be transferred at the same time. Further, the second axis of symmetry of the first sub-pixel area BB1 is perpendicular to the second axis of symmetry of the third sub-pixel area BB3. Therefore, the same transfer processing cannot be used to transfer the micro light-emitting diode in the third sub-pixel area BB3. Moreover, since the original processing for transferring the micro light-emitting diodes in the display panel is relatively complicated, if the directions of the axes of symmetry are different, the cost and efficiency of manufacturing the display panel are inevitably further increased.

Figure 12:
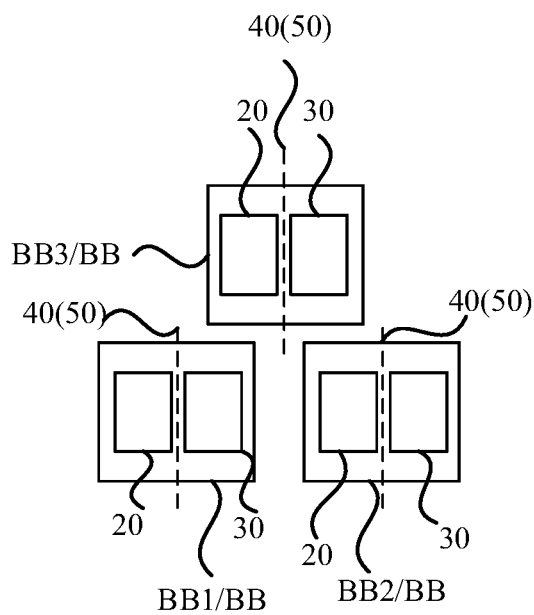
FIG. 12 is a partial structural view of a display panel according to another embodiment of the present disclosure.

FIG. 12 is a partial structural view of a display panel according to another embodiment of the present disclosure. As shown in FIG. 12, the multiple sub-pixel areas BB include a first sub-pixel area BB1, a second sub-pixel area BB2, and a third sub-pixel area BB3. The second axis of symmetry of the first sub-pixel area BB1, the second axis of symmetry of the second sub-pixel area BB2, and the second axis of symmetry of the third sub-pixel area BB3 are in parallel with each other. Since the directions of the axes of symmetry of the sub-pixel areas BB are the same, that is, whether the micro light-emitting diode is located on the main bonding pad 20 or the backup bonding pad 30, the placement directions of the micro light-emitting diodes in the sub-pixel areas BB are the same. Therefore, the same transfer processing can be used to transfer all the micro light-emitting diodes corresponding to the sub-pixel areas BB, and the processing difficulty does not increase while it is ensured that the light-emitting effect of the sub-pixel after being repaired and the light-emitting effect of the sub-pixel before being repaired are basically the same.

Optionally, in the case where the first symmetric manner and the second symmetric manner are both axisymmetric, the first symmetric reference object is the first axis of symmetry, and the second symmetric reference object is the second axis of symmetry; the first axis of symmetry is in parallel with the second axis of symmetry, and the second axis of symmetry of the sub-pixel area is in parallel with the long side of the sub-pixel area. To illustrate this beneficial effect, the following content will be compared with the case where the second axis of symmetry in the sub-pixel area in the display panel is in parallel with the short side of this sub-pixel area. The case where S1 is set to 0, that is, the first axis of symmetry coincides with the second axis of symmetry, is used as an example.

Figure 13:
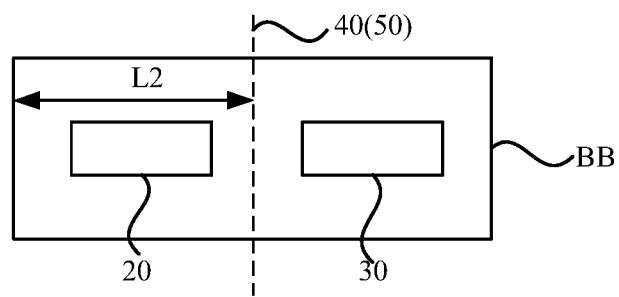
FIG. 13 is a partial structural view of a display panel according to another embodiment of the present disclosure.

Exemplarily, FIG. 13 is a partial structural view of a display panel according to another embodiment of the present disclosure. As shown in FIG. 13, the second axis of symmetry of the sub-pixel area BB is in parallel with the short side of the sub-pixel area BB. In this case, if the micro light-emitting diode on the backup bonding pad 30 is enabled to ensure the display of the sub-pixel, the distance L2 from the edge of the micro light-emitting diode to the edge of the area where the main bonding pad 20 is located is relatively long, then the light-emitting uniformity in the sub-pixel area BB covered by the light emitted by the micro light-emitting diode on the backup bonding pad 30 is relatively poor.

Figure 14:
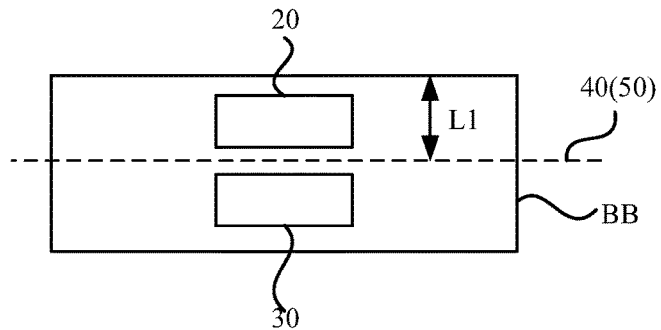
FIG. 14 is a partial structural view of a display panel according to another embodiment of the present disclosure.

FIG. 14 is a partial structural view of a display panel according to another embodiment of the present disclosure. As shown in FIG. 14, the second axis of symmetry of the sub-pixel area BB is in parallel with the long side of this sub-pixel area BB. In this case, if the micro light-emitting diode on the backup bonding pad 30 is enabled to ensure the display of the sub-pixel, the distance L1 from the edge of the micro light-emitting diode to the edge of the area where the main bonding pad 20 is located is relatively short, then the differences of light in the sub-pixel area BB covered by the light emitted by the micro light-emitting diode on the backup bonding pad 30 is relatively small, the light-emitting of the sub-pixel is relative uniform, and the display effect of the display panel can be improved.

Considering that the sub-pixel area may be provided with other structures, the specific configuration of these structures may also affect the light-emitting effect of the sub-pixel. The detailed description will be made below in conjunction with typical examples to ensure that even if the sub-pixel is repaired, the light-emitting effect of the sub-pixel after being repaired and the light-emitting effect of the sub-pixel before being repaired are basically the same. The case where the first symmetric manner and the second symmetric manner are axisymmetric, and S1 is set to 0, that is, the first symmetric reference object coincides with the second symmetric reference object, is used as an example.

Figure 15:
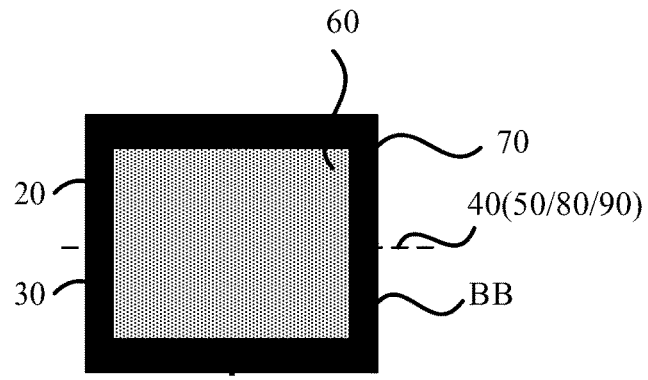
FIG. 15 is a partial structural view of a display panel according to another embodiment of the present disclosure.

Optionally, FIG. 15 is a partial structural view of a display panel according to another embodiment of the present disclosure. As shown in FIG. 15, the sub-pixel area BB includes a color resist structure 60, and the color resist structure 60 is disposed in a third symmetric manner with respect to a third symmetric reference object 80. The first symmetric manner is the same as the third symmetric manner. The distance between the vertical projection of the third symmetric reference object 80 on the first substrate 10 and the vertical projection of the first symmetric reference object 40 on the first substrate 10 is S2, and S2≤10 μm. It is to be noted that in for products with different sizes, S2 may be set by referring to the following formula: S2/Q1<50%; and Q1 is the size of the long side of the micro light-emitting diode. In FIG. 15, the case where S2 is set to 0, that is, the first reference object 40, the second reference object 50, and the third reference object 80 overlap, is used as an example.

The color of the light able to pass through the color resist structure 60 is the same as the color of the light emitted by the sub-pixel corresponding to the color resist structure 60, and the color resist structure 60 is disposed to achieve the color display of the display panel. As can be seen from the preceding content, in the case where the color resist structure 60 is made, the horn effect that a raised horn shape is formed at the overlap of the color resist structure 60 and the shielding structure occurs so that the color resist structure 60 has different edge and center morphologies. In this embodiment, the color resist structure 60 is disposed in the third symmetric manner with respect to the third symmetric reference object 80; the first symmetric manner is the same as the third symmetric manner, and the distance between the vertical projection of the third symmetric reference object 80 on first substrate 10 and the vertical projection of the first symmetric reference object 40 on the first substrate 10 is relatively short. Even though the color resist structure 60 has different edge and center morphologies, the morphologies are symmetrically arranged. Therefore, the light-emitting effect after the light emitted by the micro light-emitting diode electrically connected to the main bonding pad 20 passes through the color resist structure 60 is basically the same as the light-emitting effect after the light emitted by the micro light-emitting diode electrically connected to the backup bonding pad 30 passes through the color resist structure 60. That is, even if the sub-pixel is repaired, the light-emitting effect of the sub-pixel after being repaired and the light-emitting effect of the sub-pixel before being repaired are basically the same, which ensures the display uniformity of the display panel 100.

Based on the preceding solution, optionally, the first substrate includes a red sub-pixel area, a green sub-pixel area, and a blue sub-pixel area. This embodiment does not limit the arrangement of the red sub-pixel area, the green sub-pixel area, and the blue sub-pixel area. For example, the arrangement may be a standard arrangement or a diamond arrangement. Each sub-pixel area is provided with a main bonding pad and a backup bonding pad. The main bonding pad or the backup bonding pad in the red sub-pixel area is provided with a red micro light-emitting diode. The main bonding pad or the backup bonding pad in the green sub-pixel area is provided with a green micro light-emitting diode. The main bonding pad or the backup bonding pad in the blue sub-pixel area is provided with a blue micro light-emitting diode. In this manner, the color display of the display panel can be achieved, and meanwhile, the light-emitting effect of the sub-pixel after being repaired and the light-emitting effect of the sub-pixel before being repaired are basically the same, which ensures the display uniformity of the display panel.

Optionally, with continued reference to FIG. 15, the sub-pixel area BB further includes a shielding structure 70, and the shielding structure 70 is disposed in a fourth symmetric manner with respect to a fourth symmetric reference object 90, the first symmetric manner is the same as the fourth symmetric manner, and the distance between the vertical projection of the fourth symmetric reference object 90 on the first substrate and the vertical projection of the first symmetric reference object 40 on the first substrate is S3, and S3≤10 μm. It is to be noted that for products with different sizes, S3 may be set by referring to the following formula: S3/Q1<50%; and Q1 is the size of the long side of the micro light-emitting diode. In FIG. 15, the case where S3 is set to 0, that is, the first reference object 40, the second reference object 50, and the fourth reference object 90 overlap, is used as an example.

The shielding structure 70 may be made of a black material or a light-absorbing material of other colors, so as to absorb most of the light irradiated thereon. The shielding structure 70 is disposed to shield the light leakage between the sub-pixels. In this embodiment, the shielding structure 70 is disposed in the fourth symmetric manner with respect to the fourth symmetric reference object 90, the first symmetric manner is the same as the fourth symmetric manner, and the distance between the vertical projection of the fourth symmetric reference object 90 on the first substrate and the vertical projection of the first symmetric reference object on the first substrate is relatively short. In this manner, whether the micro light-emitting diode on the main bonding pad 20 or the micro light-emitting diode on the backup bonding pad 30 is enabled, the shielding effects of the shielding structure 70 on the light are the same so that the light-emitting effects of the sub-pixel are uniform, thereby ensuring the display uniformity of the display panel 100.

Figure 16:
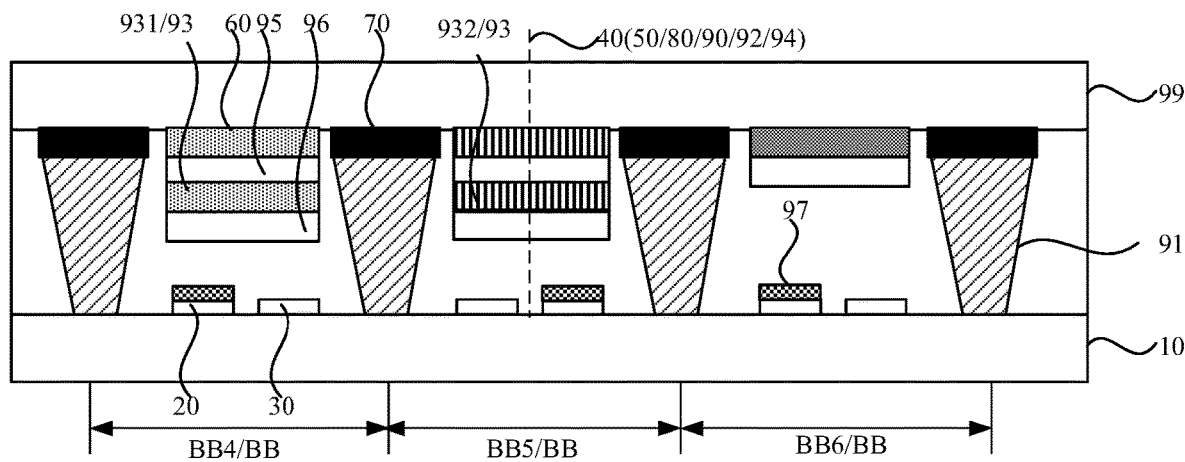
FIG. 16 is a partial structural view of a film layer of a display panel according to another embodiment of the present disclosure.

Optionally, FIG. 16 is a partial structural view of the film later of a display panel according to another embodiment of the present disclosure. As shown in FIG. 16, the sub-pixel area further includes a wall structure 91, and the wall structure 91 is disposed in a fifth symmetric manner with respect to a fifth symmetric reference object 92, the first symmetric manner is the same as the fifth symmetric manner, and the distance between the vertical projection of the fifth symmetric reference object 92 on the first substrate 10 and the vertical projection of the first symmetric reference object 40 on the first substrate 10 is S4, and S4≤10 μm. It is to be noted that for products with different sizes, S4 may be set by referring to the following formula: S4/Q1<50%; and Q1 is the size of the long side of the micro light-emitting diode. In FIG. 16, the case where S4 is set to 0, that is, the first reference object 40, the second reference object 50, the fourth reference object 90, and the fifth reference object 92 overlap, is used as an example.

The wall structure 91 is configured to limit the position of the micro light-emitting diode, and meanwhile, to prevent the crosstalk of light between adjacent sub-pixels. In this embodiment, the wall structure 91 is disposed in the fifth symmetric manner with respect to the fifth symmetric reference object 92, the first symmetric manner is the same as the fifth symmetric manner, and the distance between the vertical projection of the fifth symmetric reference object 92 on the first substrate 10 and the vertical projection of the first symmetric reference object 40 on the first substrate 10 is relatively short. In this manner, whether the micro light-emitting diode on the main bonding pad 20 or the micro light-emitting diode on the backup bonding pad 30 is enabled, the shielding effects of the wall structure 91 on the light are the same so that the light-emitting effect of the sub-pixel is uniform, thereby ensuring the display uniformity of the display panel 100.

Optionally, with continued reference to FIG. 16, at least part of the sub-pixel areas BB each further include a quantum dot structure 93, and the quantum dot structure 93 is disposed in a sixth symmetric manner with respect to a sixth symmetric reference object 94, the first symmetric manner is the same as the sixth symmetric manner, and the distance between the vertical projection of the sixth symmetric reference object 94 on the first substrate 10 and the vertical projection of the first symmetric reference object 40 on the first substrate 10 is S5, and S5≤10 μm. It is to be noted for products with different sizes, S5 may be set by referring to the following formula: S5/Q1<50%; and Q1 is the size of the long side of the micro light-emitting diode. In FIG. 16, the case where S5 is set to 0, that is, the first reference object 40, the second reference object 50, the fourth reference object 90, the fifth reference object 92, and the sixth reference object 94 overlap, is used as an example.

The quantum dot structure 93 is configured to convert the color of the light emitted by the micro light-emitting diode, and the color of the light emitted after passing through the quantum dot structure 93 is the same as the color of the light emitted by the sub-pixel corresponding to the quantum dot structure 93. As can be seen from the preceding content, for example, in the case where the quantum dot structure 93 is printed by the ink-jet printing technology, the coffee ring effect that the thickness of the quantum dot structure 93 at the edge of the sub-pixel area BB is relatively greater and the thickness of the quantum dot structure 93 in the middle part of the sub-pixel area BB is relatively less occurs so that the quantum dot structure 93 has different edge and center morphologies. In this embodiment, the quantum dot structure 93 is disposed in the sixth symmetric manner with respect to the sixth symmetric reference object 94, the first symmetric manner is the same as the sixth symmetric manner, and the distance between the vertical projection of the sixth symmetric reference object 94 on first substrate 10 and the vertical projection of the first symmetric reference object 40 on the first substrate 10 is relatively short. Even though the quantum dot structure 93 has different edge and center morphologies, the morphologies are symmetrically arranged. Therefore, whether the micro light-emitting diode on the main bonding pad 20 or the micro light-emitting diode on the backup bonding pad 30 is enabled, after the conversion performed by the quantum dot structure 93, the light-emitting effect of the sub-pixel is uniform. That is, even if the sub-pixel is repaired, the light-emitting effect of the sub-pixel after being repaired and the light-emitting effect of the sub-pixel before being repaired are basically the same, which ensures the display uniformity of the display panel 100.

Optionally, with continued reference to FIG. 16, at least part of the sub-pixel areas BB each further include a first reflecting layer 95 located above the quantum dot structure 93 (that is, one side of the quantum dot structure 93 facing away from the first substrate 10) and a second reflecting layer 96 located below the quantum dot structure 93 (that is, one side of the quantum dot structure 93 facing toward the first substrate 10). The first reflecting layer 95 and the second reflecting layer 96 are configured to form a half-wavelength cavity to increase the brightness of the quantum-dot-structure light source that vertically emits light and improve the light-emitting efficiency of the sub-pixel. Similarly, the first reflecting layer 95 and the second reflecting layer 96 are both symmetrically arranged, for example, in a centrosymmetric manner or an axisymmetric manner.

Based on the preceding solution, optionally, with continued reference to FIG. 16, the first substrate 10 includes a red sub-pixel area BB4, a green sub-pixel area BB5, and a blue sub-pixel area BB6. The red sub-pixel area BB4 includes a red quantum dot structure 931, the green sub-pixel area BB5 includes a green quantum dot structure 932, and each sub-pixel area BB is provided with a blue micro light-emitting diode 97.

In an embodiment, the red quantum dot structure 931 in the red sub-pixel area BB4 converts the blue light emitted by the blue micro light-emitting diode 97 into red light, and the green quantum dot structure 932 in the green sub-pixel area BB5 converts the blue light emitted by the blue micro light-emitting diode 97 into green light. Since the blue micro light-emitting diode 97 emits blue light, the blue sub-pixel area BB6 does not need to be provided with the quantum dot structure 93. In this manner, the color display of the display panel 100 can be completed through the preceding configuration.

Optionally, with continued reference to FIG. 16, the vertical projections of at least two of the first symmetric reference object 40, the second symmetric reference object 50, the third symmetric reference object 80, the fourth symmetric reference object 90, the fifth symmetric reference object 92, and the sixth symmetric reference object 94 on the first substrate 10 overlap with each other. In FIG. 16, the first symmetric reference object 40, the second symmetric reference object 50, the third symmetric reference object 80, the fourth symmetric reference object 90, the fifth symmetric reference object 92, and the sixth symmetric reference object 94 are all axes of symmetry, and the vertical projection of the first symmetric reference object 40, the vertical projection of the second symmetric reference object 50, the vertical projection of the third symmetric reference object 80, the vertical projection of the fourth symmetric reference object 90, the vertical projection of the fifth symmetric reference object 92, and the vertical projection of the sixth symmetric reference object 94 on the first substrate 10 overlap. That is, the main bonding pad 20 and the backup bonding pad 30 are symmetrically arranged, the sub-pixel area BB where the main bonding pad 20 and the backup bonding pad 30 are located is a symmetric area, and structures in this sub-pixel area BB such as the color resist structure 60, the wall structure 91, the quantum dot structure 93, and the shielding structure 70 are symmetrically arranged so that the light-emitting effect of the micro light-emitting diode 97 electrically connected to the main bonding pad 20 and the light-emitting effect of the micro light-emitting diode 97 electrically connected to the backup bonding pad 30 are basically the same. In this manner, even if the sub-pixel is repaired, the light-emitting effect of the sub-pixel after being repaired and the light-emitting effect of the sub-pixel before being repaired are basically the same.

Optionally, with continued reference to FIG. 16, the display panel 100 further includes a second substrate 99 through which the display panel 100 is packaged and protected. Optionally, the color resist structure 60, the quantum dot structure 93, the wall structure 91 may be disposed on the second substrate 99, and then the first substrate 10 and the second substrate 95 are bonded through a bonding process so that a display panel is formed. It is also feasible to dispose the preceding structures on one side of the micro light-emitting diode facing away from the first substrate 10 after the micro light-emitting diode is transferred. This embodiment is not limited thereto, and those skilled in the art can prepare according to the actual conditions of the product.

Figure 17:
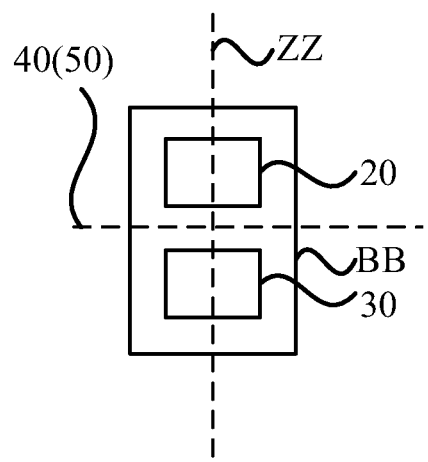
FIG. 17 is a partial structural view of a display panel according to another embodiment of the present disclosure.

The preceding embodiments are applicable to both the non-curved display panel and the curved display panel. However, the curved display panel may further be configured separately according to the characteristics of the curved display panel. Optionally, FIG. 17 is a partial structure view of another display panel according to an embodiment of the present disclosure. As shown in FIG. 17, in the case where the display panel 100 is a curved display panel, the display panel 100 includes a bending portion 110, and a bending axis ZZ of the bending portion 110 is perpendicular to the first axis of symmetry and the second axis of symmetry. In FIG.

17, the case where the first axis of symmetry coincides with the second axis of symmetry is used as an example. The advantage of this arrangement is that even if the bending portion 110 may cause the film layer (such as the color resist structure or the quantum dot structure) disposed on the bending portion 110 to be deformed, since the bending axis ZZ of the bending portion 110 is perpendicular to the first axis of symmetry and the second axis of symmetry, the deformation of the film layer is also symmetric, which avoids the problem that the light-emitting effect of the sub-pixel after being repaired and the light-emitting effect of the sub-pixel before being repaired are different in the case where the deformation is asymmetric.

Based on the same concept, an embodiment of the present disclosure further provides a display device. This display device includes the display panel described in any embodiment of the present disclosure. Therefore, the display device provided in embodiments of the present disclosure has the corresponding beneficial effects of the display panel provided in embodiments of the present disclosure, which is not be repeated herein. Exemplarily, this display device may be a mobile phone, a computer, a smart wearable device (such as a smart watch), an onboard display device, and other electronic devices and no limitations are made thereto in embodiments of the present disclosure.

Figure 18:
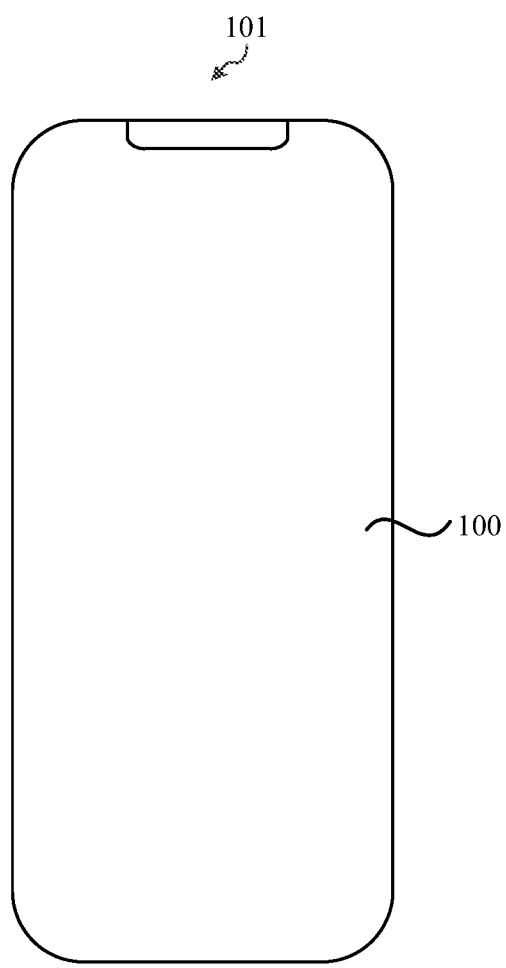
FIG. 18 is a structural view of a display device according to an embodiment of the present disclosure.

Exemplarily, FIG. 18 is a structural view of a display device according to an embodiment of the present disclosure. As shown in FIG. 18, the display device 101 includes the display panel 100 described in the preceding embodiments of the present disclosure.

It is to be noted that the above are merely preferred embodiments of the present disclosure and the principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A display panel, comprising a first substrate, wherein the first substrate comprises a plurality of sub-pixel areas arranged in an array, and at least one of the plurality of sub-pixel areas comprises:
    a main bonding pad and a backup bonding pad which are disposed on the first substrate; and
    a micro light-emitting diode electrically connected to the main bonding pad or the backup bonding pad,
    wherein the main bonding pad and the backup bonding pad are disposed in a first symmetric manner with respect to a first symmetric reference object;
    the at least one of the plurality of sub-pixel areas comprises a color resist structure, and the color resist structure is disposed in a third symmetric manner with respect to a third symmetric reference object; the third symmetric manner is the same as the first symmetric manner; and
    a distance between a vertical projection of the third symmetric reference object on the first substrate and the vertical projection of the first symmetric reference object on the first substrate is S2, wherein S2≤10 μm.

2. The display panel of claim 1, wherein at least one of the plurality of sub-pixel areas is disposed in a second symmetric manner with respect to a second symmetric reference object;
    the second symmetric manner is the same as the first symmetric manner; and
    a distance between a vertical projection of the first symmetric reference object on the first substrate and a vertical projection of the second symmetric reference object on the first substrate is S1, wherein S1≤10 μm; and
    wherein the first symmetric manner and the second symmetric manner are both axisymmetric; the first symmetric reference object is a first axis of symmetry, and the second symmetric reference object is a second axis of symmetry; and the first axis of symmetry is parallel to the second axis of symmetry.

3. The display panel of claim 2, wherein the second axes of symmetry of the plurality of sub-pixel areas are in parallel with each other.

4. The display panel of claim 2, wherein the second axis of symmetry of the each of the plurality of sub-pixel areas is in parallel with a long side of the each of the plurality of sub-pixel areas.

5. The display panel of claim 2, wherein the display panel comprises a bending portion; wherein a bending axis of the bending portion is perpendicular to the first axis of symmetry and the second axis of symmetry.

6. The display panel of claim 1, wherein the first symmetric manner is centrosymmetric; and the first symmetric reference object is a first center of symmetry.

7. The display panel of claim 6, wherein the main bonding pad comprises a first main bonding pad and a second main bonding pad; wherein the backup bonding pad comprises a first backup bonding pad and a second backup bonding pad; and
    wherein a projection of the first backup bonding pad on a connecting line of the first main bonding pad with the second main bonding pad is located within a gap between the first main bonding pad and the second main bonding pad; wherein a projection of the second main bonding pad on a connecting line of the first backup bonding pad with the second backup bonding pad is located within a gap between the first backup bonding pad and the second backup bonding pad.

8. The display panel of claim 1, wherein a distance between the main bonding pad and the backup bonding pad ranges from 10 μm to 50 μm.

9. The display panel of claim 1, wherein the first substrate comprises a red sub-pixel area, a green sub-pixel area, and a blue sub-pixel area; wherein the red sub-pixel area is provided with a red micro light-emitting diode, wherein the green sub-pixel area is provided with a green micro light-emitting diode, and wherein the blue sub-pixel area is provided with a blue micro light-emitting diode.

10. A display panel, comprising a first substrate, wherein the first substrate comprises a plurality of sub-pixel areas arranged in an array, and at least one of the plurality of sub-pixel areas comprises:
    a main bonding pad and a backup bonding pad which are disposed on the first substrate; and
    a micro light-emitting diode electrically connected to the main bonding pad or the backup bonding pad,
    wherein the main bonding pad and the backup bonding pad are disposed in a first symmetric manner with respect to a first symmetric reference object, at least one of the plurality of sub-pixel areas further comprises a shielding structure, wherein the shielding structure is disposed in a fourth symmetric manner with respect to a fourth symmetric reference object; the fourth symmetric manner is the same as the first symmetric manner; and the micro light-emitting diode and the shielding structure do not overlap with each other along a direction perpendicular to a plane in which the first substrate is located; wherein a distance between a vertical projection of the fourth symmetric reference object on the first substrate and the vertical projection of the first symmetric reference object on the first substrate is S3, wherein S3≤10 μm.

11. The display panel of claim 10, wherein each of the plurality of sub-pixel areas further comprises a wall structure, wherein the wall structure is disposed in a fifth symmetric manner with respect to a fifth symmetric reference object; wherein the fifth symmetric manner is the same as the first symmetric manner; and wherein a distance between a vertical projection of the fifth symmetric reference object on the first substrate and the vertical projection of the first symmetric reference object on the first substrate is S4, wherein S4≤10 μm.

12. The display panel of claim 11, wherein at least part of the plurality of sub-pixel areas each further comprise a quantum dot structure, wherein the quantum dot structure is disposed in a sixth symmetric manner with respect to a sixth symmetric reference object; wherein the sixth symmetric manner is the same as the first symmetric manner; and wherein a distance between a vertical projection of the sixth symmetric reference object on the first substrate and the vertical projection of the first symmetric reference object on the first substrate is S5, wherein S5≤10 μm.

13. The display panel of claim 12, wherein vertical projections of at least two of the first symmetric reference object, the second symmetric reference object, the third symmetric reference object, the fourth symmetric reference object, the fifth symmetric reference object, and the sixth symmetric reference object on the first substrate overlap with each other.

14. The display panel of claim 12, wherein the first substrate comprises a red sub-pixel area, a green sub-pixel area, and a blue sub-pixel area; wherein the red sub-pixel area comprises a red quantum dot structure, wherein the green sub-pixel area comprises a green quantum dot structure, and wherein each of the plurality of sub-pixel areas is provided with a blue micro light-emitting diode.

15. A display device, comprising a display panel, wherein the display panel comprises a first substrate, wherein the first substrate comprises a plurality of sub-pixel areas arranged in an array, and wherein at least one of the plurality of sub-pixel areas comprises:
a main bonding pad and a backup bonding pad both of which are disposed on the first substrate; and
a micro light-emitting diode electrically connected to the main bonding pad or the backup bonding pad,
wherein the main bonding pad and the backup bonding pad are disposed in a first symmetric manner with respect to a first symmetric reference object;
the at least one of the plurality of sub-pixel areas comprises a color resist structure, and the color resist structure is disposed in a third symmetric manner with respect to a third symmetric reference object; the third symmetric manner is the same as the first symmetric manner; and
a distance between a vertical projection of the third symmetric reference object on the first substrate and the vertical projection of the first symmetric reference object on the first substrate is S2, wherein S2≤10 μm.

16. The display device of claim 15, wherein at least one of the plurality of sub-pixel areas is disposed in a second symmetric manner with respect to a second symmetric reference object;
wherein the second symmetric manner is the same as the first symmetric manner; and
wherein a distance between a vertical projection of the first symmetric reference object on the first substrate and a vertical projection of the second symmetric reference object on the first substrate is S1, wherein S1≤10 μm; and
wherein the first symmetric manner and the second symmetric manner are both axisymmetric; wherein the first symmetric reference object is a first axis of symmetry, and wherein the second symmetric reference object is a second axis of symmetry; and the first axis of symmetry is in parallel with the second axis of symmetry.

17. The display device of claim 15, wherein the first symmetric manner is centrosymmetric; and the first symmetric reference object is a first center of symmetry.

18. The display device of claim 15, wherein each of the plurality of sub-pixel areas comprises a color resist structure, wherein the color resist structure is disposed in a third symmetric manner with respect to a third symmetric reference object; wherein the third symmetric manner is the same as the first symmetric manner; and
wherein a distance between a vertical projection of the third symmetric reference object on the first substrate and the vertical projection of the first symmetric reference object on the first substrate is S2, wherein S2≤10 μm.

19. The display device of claim 18, wherein each of the plurality of sub-pixel areas further comprises a shielding structure disposed in a fourth symmetric manner with respect to a fourth symmetric reference object; wherein the fourth symmetric manner is the same as the first symmetric manner; and wherein a distance between a vertical projection of the fourth symmetric reference object on the first substrate and the vertical projection of the first symmetric reference object on the first substrate is S3, wherein S3≤10 μm.

* * * * *